United States Patent
Braasch et al.

(10) Patent No.: US 10,657,948 B2
(45) Date of Patent: May 19, 2020

(54) SOUND MASKING IN OPEN-PLAN SPACES USING NATURAL SOUNDS

(71) Applicant: Rensselaer Polytechnic Institute, Troy, NY (US)

(72) Inventors: Jonas Braasch, Latham, NY (US); Alana Gloria DeLoach, Troy, NY (US); Jeffrey Parkman Carter, Cohoes, NY (US)

(73) Assignee: Rensselaer Polytechnic Institute, Troy, NY (US)

(*) Notice: Subject to any disclaimer, the term of this patent is extended or adjusted under 35 U.S.C. 154(b) by 0 days.

(21) Appl. No.: 15/568,909

(22) PCT Filed: Apr. 22, 2016

(86) PCT No.: PCT/US2016/028798
§ 371 (c)(1),
(2) Date: Oct. 24, 2017

(87) PCT Pub. No.: WO2016/172446
PCT Pub. Date: Oct. 27, 2016

(65) Prior Publication Data
US 2018/0122353 A1    May 3, 2018

Related U.S. Application Data

(60) Provisional application No. 62/299,802, filed on Feb. 25, 2016, provisional application No. 62/152,337, filed on Apr. 24, 2015.

(51) Int. Cl.
*G10K 11/175* (2006.01)
*H04K 3/00* (2006.01)
(Continued)

(52) U.S. Cl.
CPC ............ *G10K 11/175* (2013.01); *G10L 25/18* (2013.01); *H03G 5/165* (2013.01); *H04K 3/43* (2013.01);
(Continued)

(58) Field of Classification Search
None
See application file for complete search history.

(56) References Cited

U.S. PATENT DOCUMENTS 4,438,526 A    3/1984 Thomalla
4,661,982 A    4/1987 Kitazato et al.
(Continued)

FOREIGN PATENT DOCUMENTS

WO    2004095877 A2    11/2004

OTHER PUBLICATIONS

Foreign priority document EM15151843 for US-20170316773-A1 (Year: 2015).*
(Continued)

*Primary Examiner* — James K Mooney
(74) *Attorney, Agent, or Firm* — Murtha Cullina LLP; Anthony P. Gangemi

(57) ABSTRACT

A system, method and program product for generating sound masking in an open-plan space. A method is disclosed that includes: establishing a set of acoustic criteria for the space that specifies minimum output levels at a set of specified frequencies; mixing sound samples to create an audio output stream for use as sound masking when broadcast over at least one speaker using a power amplifier; and processing the audio output stream, wherein the processing includes: analyzing the audio output stream with a spectrum analyzer to determine if the minimum output levels at the set of specified frequencies are met; and level adjusting the audio output stream with an equalizer to ensure that minimum
(Continued)

output levels at the set of specified frequencies are met but do not exceed a given threshold above the minimum level.

27 Claims, 4 Drawing Sheets

(51) Int. Cl.
| | |
|---|---|
| *G10L 25/18* | (2013.01) |
| *H03G 5/16* | (2006.01) |
| *H04R 3/04* | (2006.01) |
| *H04R 29/00* | (2006.01) |

(52) U.S. Cl.
CPC ............... *H04K 3/825* (2013.01); *H04K 3/84* (2013.01); *H04K 3/94* (2013.01); *H04R 3/04* (2013.01); *H04R 29/002* (2013.01); *H04K 3/42* (2013.01); *H04K 2203/12* (2013.01); *H04K 2203/34* (2013.01); *H04K 2203/36* (2013.01)

(56) References Cited

U.S. PATENT DOCUMENTS

| | | | |
|---|---|---|---|
| 4,674,124 | A | 6/1987 | Horrall et al. |
| 4,914,706 | A | 4/1990 | Krause |
| 5,036,542 | A | 7/1991 | Kehoe et al. |
| 6,188,771 | B1 | 2/2001 | Horrall |
| 7,194,094 | B2 | 3/2007 | Horrall et al. |
| 8,666,086 | B2 | 3/2014 | Moeller et al. |
| 8,798,284 | B2 | 8/2014 | Cartwright et al. |
| 2009/0003617 | A1 | 1/2009 | Goldman et al. |
| 2011/0251704 | A1 | 10/2011 | Walsh et al. |
| 2013/0016847 | A1 | 1/2013 | Steiner |
| 2014/0309991 | A1* | 10/2014 | Arvanaghi ............ G10K 11/175 704/201 |
| 2017/0316773 | A1* | 11/2017 | Walther ............... G10K 11/175 |

OTHER PUBLICATIONS

International Search Report and Written Opinion dated Jul. 25, 2016 for PCT/US2016/028798 filed Apr. 22, 2016; pp. 12.

Bakker, S. et al.; "Exploring interactive systems using peripheral sounds"; TU/e (Technische Universiteit Eindhove University of Technology; Proceedings of the 5th International Workshop Haptic and Audio Interaction Design (HAID 2010; Sep. 16-17, 2010; Copenhagen, Denmark; Published Jan. 1, 2010.

Unknown; "Advantages of QtPro Sound Masking/Matter than White Noise"; Cambridge Sound Management; pp. 2; Printed Oct. 24, 2017; <http://cambridgesound.com/advantages/>.

Claessen, F.T.C.; "The Sound of Sleep: Determining types of sounds, their adaptability upon disturbances, and their implementation in a sound masking device in the context of sleep"; Industrial Design Engineering; Dec. 6, 2010; pp. 4; Printed Oct. 24, 2017; <https://repository.tudelft.nl/islandora/object/uuid:8bf4af95-4932-473f-b73a-55e173a78435/?collection=research>.

Haapakangas, A. et al.; "Effects of Five Speech Masking Sounds on Performance and Acoustic Satisfaction. Implications for Open-Plan Offices"; Acta Acustica United with Acustica; vol. 97; No. 4; Jul./Aug. 2011; pp. 641-655.

Largo-Wight, Erin et al.; "Healthy Workplaces: The Effects of Nature Contact at Work on Employee Stress and Health"; Public Health Reports 2011; Printed Oct. 24, 2017; pp. 10; Copyright 2011 Association of Schools of Public Health; <https://www.ncbi.nlm.nig.gov/pmc/articles?PMC3072911/>.

Unknown; "System Solutions for Sound Masking, Paging, Audio and Mass Notification and Emergency Communication (MNEC)"; Lencore Products; Printed Oct. 24, 2017; pp. 2; <http://www.lencore.com/Products/SpectraSoundMasking>.

Unknown; "Sound Masking Systems/Nature Sounds"; Sound Oasis; Printed Oct. 24, 2017; p. 2; Copyrights Headwaters Inc.; <https://www.soundoasis.com/how-we-can-help/office-privacy/>.

* cited by examiner

Sound Masking Curve (45.0 dBA Overall Volume)

| Band Center Frequency (Hz) | Target Band Level (dB) |
|---|---|
| 100 | 46.9 |
| 125 | 45.9 |
| 160 | 44.7 |
| 200 | 43.9 |
| 250 | 42.7 |
| 315 | 41.4 |
| 400 | 40.4 |
| 500 | 38.9 |
| 630 | 37.4 |
| 800 | 35.4 |
| 1,000 | 33.7 |
| 1,250 | 31.4 |
| 1,600 | 29.4 |
| 2,000 | 27.4 |
| 2,500 | 24.9 |
| 3,150 | 22.4 |
| 4,000 | 19.4 |
| 5,000 | 16.4 |

*Source: National Research Council of Canada sound masking curve from 100-5000 Hz. For curves at different overall volumes, adjust target band levels by 1 dB for each 1 dBA change in overall volume.*

Figure 1

SOUND MASKING IN OPEN-PLAN SPACES USING NATURAL SOUNDS

PRIORITY CLAIM

This application claims priority to U.S. provisional patent applications "A sound masking system utilizing "natural" sounds in open-plan offices to enhance cognitive capabilities of workers while meeting acoustical standards," Ser. No. 62/299,802, filed on Feb. 25, 2016, and "A sound masking system utilizing "natural" sounds in open-plan offices to enhance cognitive capabilities of workers while meeting acoustical standards" Ser. No. 62/152,337, filed on Apr. 24, 2015, the contents of which are hereby incorporated by reference.

This invention was made with government support under 1320059 awarded by NSF. The government has certain rights to this invention.

TECHNICAL FIELD

The subject matter of this invention relates to sound masking, and more particularly relates to a sound masking system for open-plan offices using natural sounds that adheres predefined acoustical standards.

BACKGROUND

With the gain in popularity of open-plan office design and the engineering efforts to achieve acoustical comfort for building occupants, a majority of workers still report dissatisfaction in their workplace environment. Office acoustics influence organizational effectiveness, efficiency, and satisfaction through meeting appropriate requirements for speech privacy and ambient sound levels. Implementing a sound masking system is one method of achieving privacy goals. Although each sound masking system may be tuned for its specific environment, the use of random steady state electronic noise has essentially remained the primary approach for decades.

One goal of sound masking is speech privacy. Speech privacy affects both the talker and the listener. On the part of the talker, speech privacy becomes an issue of confidentiality. On the part of the listener, speech privacy ensures the mitigation of acoustical distraction and annoyance, thus facilitating a more concentrative environment. Factors that affect speech privacy are room absorption factors, speech effort, talker's orientation, privacy expectations, background noise, noise reduction of common constructions, barrier attenuation (i.e., partial height workstation barriers), and source to listener distance.

Traditionally, sound masking systems are installed as speaker arrays placed in the plenums above suspended ceilings pointing up towards the roof deck. This configuration allows for a more even distribution of sound. It is important that building occupants cannot localize the source of the masking sound. The masker is most successful when it has complete spatial and temporal uniformity in the room. The overall level is also important. Industry standards suggest a range between 40-45 dBA for an overall sound pressure level. The masking spectrum typically ranges from 100-5,000 Hz, or sometimes from 800-8,000 Hz and possesses suggested "roll-off" values in dB level per ⅓rd octave frequency band.

As noted, in most cases, the signal or sound source for commercially based sound masking systems is a random, steady state electronic noise. While design engineers have offered dynamic solutions to improve satisfaction in the workplace environment, the sound masking signal has largely remained the same for over 40 years.

SUMMARY

Described herein are solutions for sound masking that adhere to predefined acoustic guidelines using non-repetitive soundscapes in an open-plan office.

In a first aspect, the disclosure provides a method of generating sound masking in an open-plan space, comprising: establishing acoustic criteria for the open-plan space that specifies minimum output levels at a set of specified frequencies; mixing sound samples to create an audio output stream for use as sound masking when broadcast over at least one speaker using a power amplifier; and processing the audio output stream, wherein the processing includes: analyzing the audio output stream with a spectrum analyzer to determine if the minimum output levels at the set of specified frequencies are met; and level adjusting the audio output stream with an equalizer to ensure that minimum output levels at the set of specified frequencies are met.

In a second aspect, the disclosure provides a system for generating sound masking, comprising: a system for establishing acoustic criteria for the space that specifies minimum and maximum output levels at a set of specified frequencies; a system for mixing sound samples to create an audio output stream for use as sound masking when broadcast over at least one speaker using a power amplifier; and a system for processing the audio output stream, wherein the system for processing includes: a spectral analyzer that analyzes the audio output stream to determine if the minimum and maximum output levels at the set of specified frequencies are met; and an equalizer that level adjusts the audio output stream to ensure that the minimum and maximum output levels at the set of specified frequencies are met.

In a third aspect, the disclosure provides a computer program product stored on a computer readable storage medium, which when executed by a computing system, provides sound masking, comprising: program code for establishing acoustic criteria for the space that specifies minimum output levels at a set of specified frequencies; program code for mixing sound samples to create an audio output stream for use as sound masking when broadcast over at least one speaker using a power amplifier; and program code for processing the audio output stream, wherein the processing includes: program code that analyzes the audio output stream to determine if the minimum output levels at the set of specified frequencies are met; and program code that level adjusts the audio output to ensure that minimum output levels at the set of specified frequencies are met.

BRIEF DESCRIPTION OF THE DRAWINGS

These and other features of this invention will be more readily understood from the following detailed description of the various aspects of the invention taken in conjunction with the accompanying drawings in which:

FIG. 1 depicts specified acoustic criteria in the form of minimum sound pressure levels at specified frequencies, according to embodiments.

Figure 2:
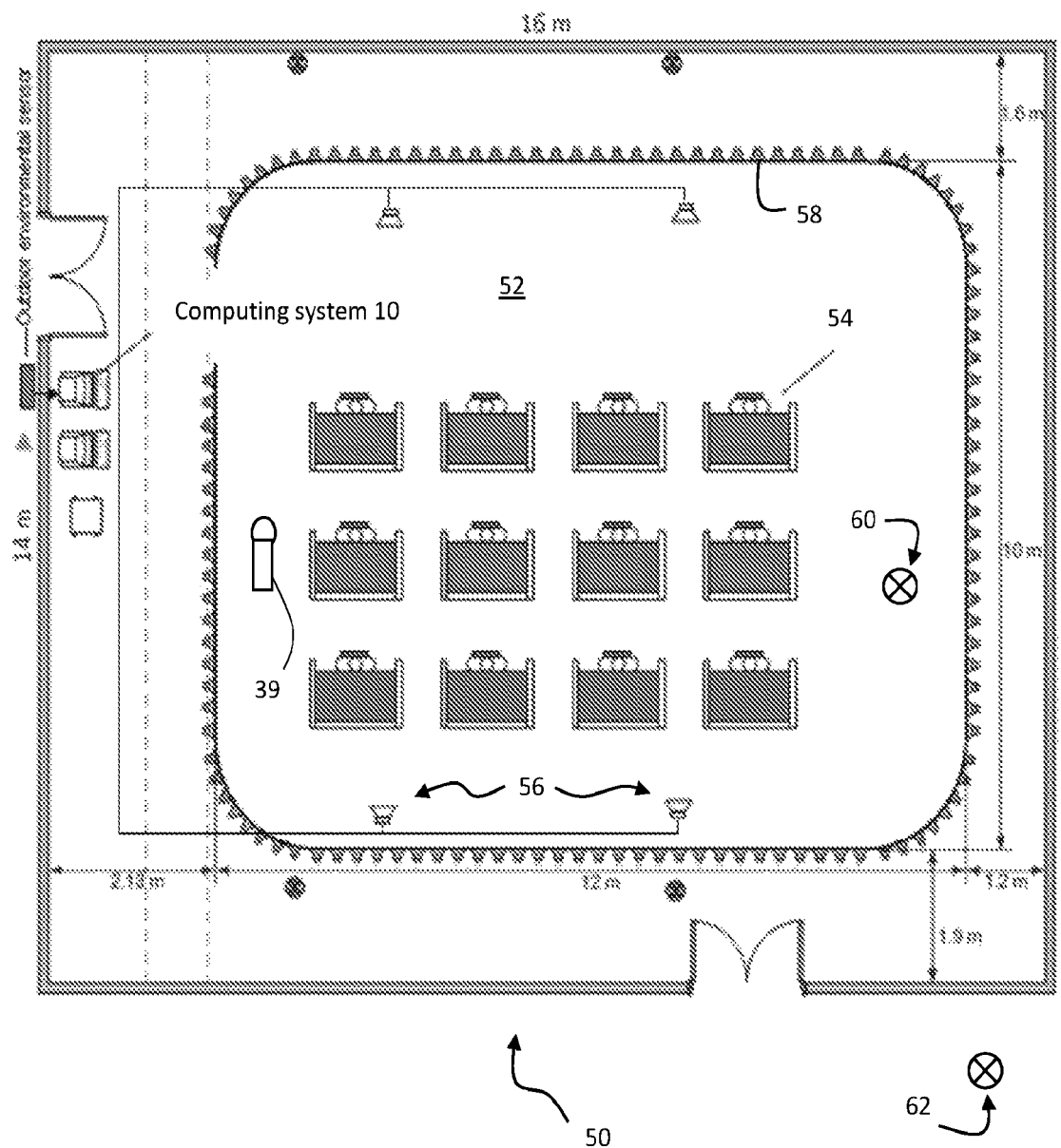
FIG. 2 depicts an open-plan space having a natural soundscape masking system according to embodiments.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

The present approach provides a sound masking solution that utilizes non-repetitive soundscapes in an open-plan office that adhere to predefined acoustic guidelines. FIG. 1 depicts one illustrative guideline for a sound masking spectrum curve (i.e., minimum pressure thresholds) set forth by the National Research Council of Canada (NRCC). This standard requires that maskers be calibrated in-situ to 45 dBA and the overall soundscapes be calibrated to 48 dBA in-situ. A-Weighted sound pressure levels correspond to noise criteria (NC) ratings of NC 35 to NC 40, standard ratings for large open-plan offices. As can be seen, each different frequency band has a target (i.e., minimum) sound pressure level measured in decibels. A further standard is provided by the ASTM E1130 Standard for Sound Masking in Open Offices, which similarly specifies the minimum sound pressure levels at specified frequency bands, e.g., third octave bands need to be at 60 Hz to 16 kHz. Embodiments described herein provide a system and method for adhering to such a standard when something other than a purely steady state noise signal, such as a natural soundscape, is utilized for sound masking.

Natural soundscapes comprise generated audio signals of sounds that occur in the natural world, generally without human intervention, e.g., wind, rain, water flowing, animal sounds, ocean sounds, trees rustling, etc. The soundscape may include actual recordings or computer generated sounds that closely mimic actual sounds found in nature. Reasons for the use of natural soundscapes include the premise that exposure to a natural soundscape has the ability to (i) restore attentional capacity, (ii) enhance cognitive capabilities of workers in an open-plan space, and (iii) be preferred over steady noise maskers. Accordingly, embodiments described herein allow for the creation and use of a non-repetitive natural soundscape that adheres to predefined guidelines, such as the aforementioned standards.

FIG. 2 depicts an image of an open-plan office 50 having a natural soundscape environment 52. Open-plan office 50 generally includes an enclosed space having multiple workstations 54, i.e., desks, cubicles, tables, etc., at which people perform cognitive tasks. Natural soundscape environment 52 generally includes a computing system 10 for creating an audio output stream, an amplifier and speakers 56 for broadcasting the audio output stream, and acoustical structures 58, e.g., walls, fabrics, deflectors, etc. Also provided are internal environment sensors 60 and external environment sensors 62 that may be utilized to help select the audio content being played, e.g., if it is raining outside, then the natural soundscape may include the sound of rain. A microphone 39 may also be used to collect audio signals from the broadcast for feedback to the computing system 10 to ensure adherence with the specified acoustic criteria, e.g., a predefined standard, user defined settings, guidelines, etc.

Figure 3:
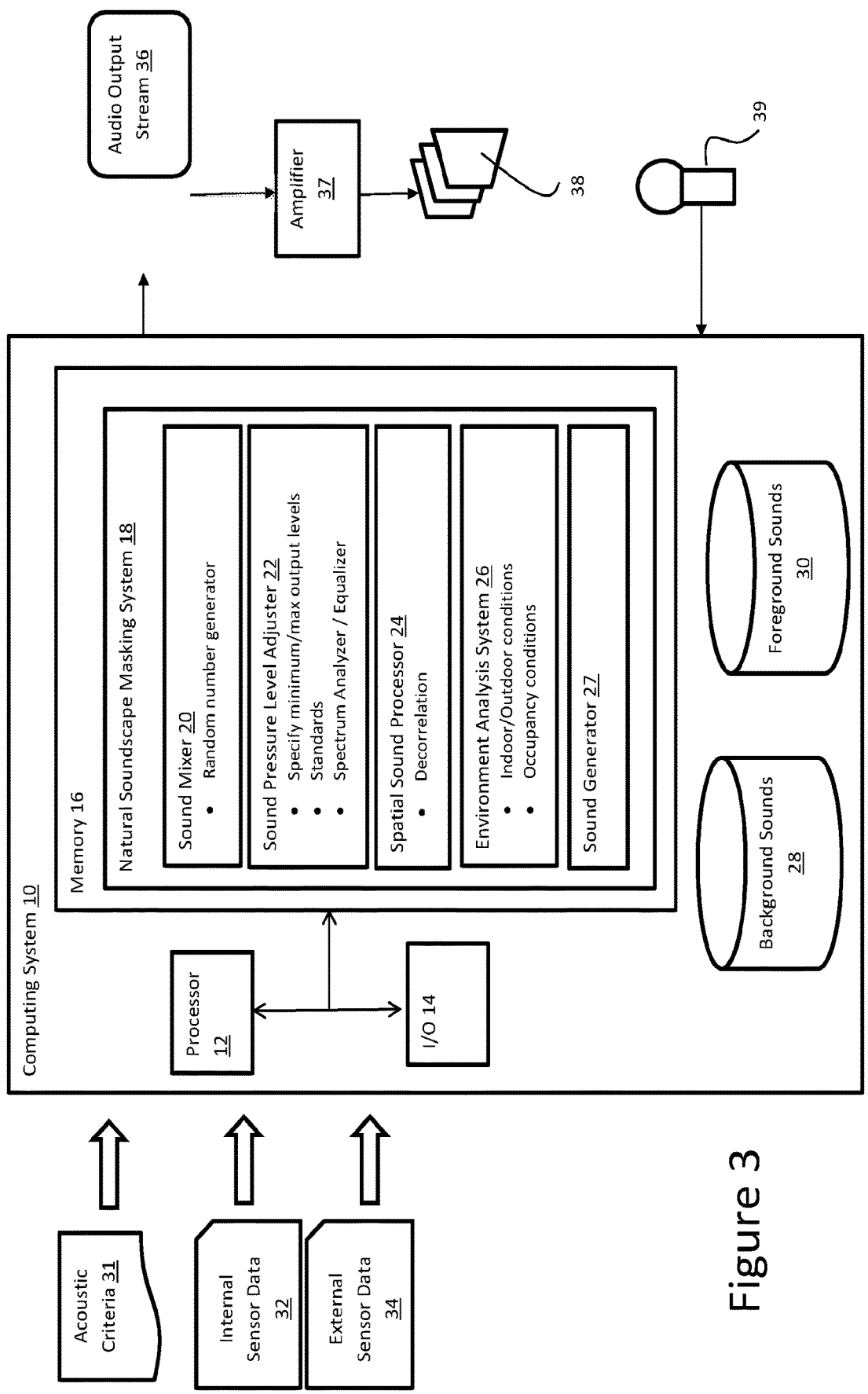
FIG. 3 depicts a computing system having a natural soundscape masking system according to embodiments.

FIG. 3 depicts an illustrative computing system 10 having a natural soundscape masking system 18 that generates an audio output stream 36, e.g., comprising a natural soundscape, for broadcast by an amplifier 37 and set of loudspeakers 38 in an open-plan space such as an office. Natural soundscape masking system 18 generally includes: a sound mixer 20 that generates a non-repetitive audio output stream 36 from a database or generation of sound samples; a sound pressure level adjuster 22 that ensures that the broadcast meets the specified acoustic criteria 31 (i.e., minimum output levels set by predetermined standards or guidelines) and optionally does not exceed a set threshold (e.g., 2 dB) above each level criterion; a spatial sound processor 24 that decorrelates the audio output stream 36 to increase perceived spaciousness; and an environment factoring system 26 that factors external (i.e., outdoor) and internal (i.e., indoor) conditions to further enhance the audio output stream 36.

In one illustrative embodiment, sound mixer 20 may utilized a live mixing technique that mixes sound samples that include background sounds 28 and foreground sounds 30 to create a complex natural soundscape 36 that is non-repetitive. In such an approach, probability weights for different sound samples may be dynamically adjusted based on sensor inputs. For example, inputs to weigh the probability of playing a particular sound sample can include local weather data from internet providers, time of day, season (e.g., winter sounds in winter or summer sounds in summer), and current occupant data (e.g., from visual tracking, or time of flight sensors).

Background sounds 28 are the primary masking signals in the created natural soundscape 36, and are provided by a set of sound samples. The sound samples can consist of prerecorded segments of natural sounds, e.g., streaming water, wind, ocean waves, etc. Samples may be stored in files that are selected randomly using random entry and exit points, which are assembled into a continuous audio output stream 36. Further, audio output stream 36 can be superposed from multiple foreground and background sound files. Samples can be cross faded when one sample is terminated and the next sample is blended in.

Backgrounds sounds 28 may be adjusted based on internal sensor data 32, e.g., if there is only one person in the space, then sound masking levels can be minimized since speech privacy masking is not needed. Similarly, if it is late at night when the office is typically minimally staffed, the background sounds 28 can be adjusted accordingly.

Foreground sounds 30 may likewise be obtained from sound files or be generated using a stochastic process. Foreground sounds 30 generally include event-driven sounds to provide signature moments to the natural soundscape 36 and do not have to contribute to sound masking. The foreground sounds 30 are typically of a short duration, e.g., a bird whistle, rustling of leaves, etc. The foreground sounds 30 may be selected randomly or based on external conditions that can connote environmental information. For instance, bird sounds can be used to indicate a certain time of the day. Foreground sounds 30 can also connote outside world conditions, e.g., gusty winds, hard rain, etc., which may be useful to remind occupants to dress warmly or bring an umbrella when leaving the office.

The foreground sounds 30 are selected using a random process in which each sound sample includes a probability weight that changes temporally based on a set of inputted or detected parameters. For example, wind gust sound samples may be assigned a low probability weight if there is no wind outside the open-plan office and higher probability weight if winds are detected, e.g., using external sensor data 34. Further, probability weights may be adjusted based on an amount of time since the sample was last played in order to avoid repetitive playing of the same sample. In addition, weights may be adjusted based on downloaded weather forecast data for the day or be adjusted based on the time of day or season the year. For instance, if there is a high probability of rain late in the day, weights associated with rain sounds can be increased. If it is a spring day with a forecast for warm sun, weights associated with bird mating sounds may be increased.

Rather than, or in addition to using stored files, sound samples can be generated by a sound generator 27 to synthetically use physical modeling and stochastic processes to generate sounds.

Sound pressure level adjuster 22 ensures that the natural soundscape signal meets the minimum threshold required to provide a necessary level of sound masking, e.g., as determined by a set of specified acoustic criteria 31. Acoustic criteria 31 may be specified in any manner, e.g., an administrator may select a criterion from a set of criteria (e.g., using drop down boxes in administrative interface), the administrator may define the levels and frequency bands that make up the acoustic criteria 31, the acoustic criteria may be based on the size and proportions of the open-plan space, etc. Regardless, sound pressure level adjuster 22 ensures compliance with the acoustic criteria 31 by analyzing the audio output stream 36 with a spectrum analyzer, either before the audio is broadcast or based on microphone 39 feedback, and then level adjusting the frequency bands with an equalizer to ensure compliance. The sound pressure adjuster 22 may also ensure that the sound pressure level does not exceed a defined "maximum" threshold above the minimum sound pressure level at each frequency. For example, if the criterion at 100-Hz is 46.9 dB and the threshold is 3 dB, the sound pressure adjuster will ensure that the level at this frequency always ranges between 46.9 dB and 49.9 dB. Thus, sound pressure processor 24 ensures that the broadcasted audio output stream is continuously above the specified acoustic criteria (i.e., the minimum is met) without becoming unnecessarily loud (i.e., the maximum is met).

A spectrum analyzer is used to measure the sound pressure level in each band over a given integration window. For each band, a comparator may be used to measure the difference between the actual and the required (i.e., minimum) level. A negative level indicates that the actual level is below the required level. In this case an equalizer, e.g., a voltage controlled amplifier or a computer code serving in a similar function, may be used to slowly adjust the level upward above the minimum to meet the acoustic criteria 31. The rate of increase may occur according to Ld/T in which T is an adjustment constant and Ld is the level difference reported by the comparator. A positive level indicates that the actual level is above the required level. A second threshold may be established to determine if the actual level exceeds the second (maximum) threshold indicating the band output is too loud If exceed, the level may be adjusted downward to an acceptable level below the maximum threshold.

The audio output stream 36 may be delayed to ensure that the level has been adjusted before the sound is exposed to the room. Alternatively, the volume can be adjusted as needed in separate audio filters to adjust each band to the correct level. A further threshold can be used to limit the deviation of the individual bands from each other from the original recording, e.g., 6 dB, to avoid the natural soundscapes sounding unnatural.

Spatial sound processor 26 may be utilized to increase the perceived spaciousness of open-plan office spaces. It is well known from architectural acoustical research that listeners prefer the sound of acoustically perceived wide, enveloping spaces. The spatial sound processor 26 will lead to the impression of larger spaces to workers confined in an enclosed space for long periods in time. The solution is similar to that used in concert halls to decorrelate the sound arriving to both ears using the sound reflections of the room. It is known that rooms are perceived wider with decreasing coherence between both ears. The same effect can be achieved by using multiple decorrelated noise signals played back from distributed loudspeakers. To achieve this, multiple pairs of short term samples are computed and each pair is analyzed for coherence. Then the pair with the lowest coherence is selected to create the impression of a decoherent sound that provides the aural impression of a larger space than the office actually occupies. Any type of wave field synthesis, (higher-order) ambisonics, or amplitude panning may be used to obtain spatialize sounds.

As noted, environmental analysis system 26 utilizes internal sensor data 32 and external sensor data 34 to help sound mixer 20 select sound samples. Internal sensor data 32 generally refers to sensor information collected from within the open-plan space and external sensor data 34 refers to sensor information collected outside the open-plan space. In addition, parameters such as time of day, time of the year, etc., may be used by environmental analysis system 26. Thus for example, the criteria of minimum sound pressure level can be adjusted over time based on the time of the day, week day and room occupancy. Room occupancy can be determined by camera tracking, time of flight sensor, etc. Further, acoustic criteria 31 can be adjusted based on any sound being produced in the room by occupants, for example the amount of spoken dialogue, a television broadcast, music broadcast, etc. The selection of sound samples may be based on current, local weather conditions (e.g., wind, rain, etc.) to provide the occupants with feedback about the current outside weather conditions. Further, the selection may be based on time of day, e.g., early morning bird calls, or time of the year, e.g., wintertime howling winds.

In still further embodiments, biotrackers may be worn by occupants to determine internal factors (e.g., stress) thus allowing sound samples to be selected to mitigate the internal states of occupants (e.g., provide sounds for stress relief).

Figure 4:
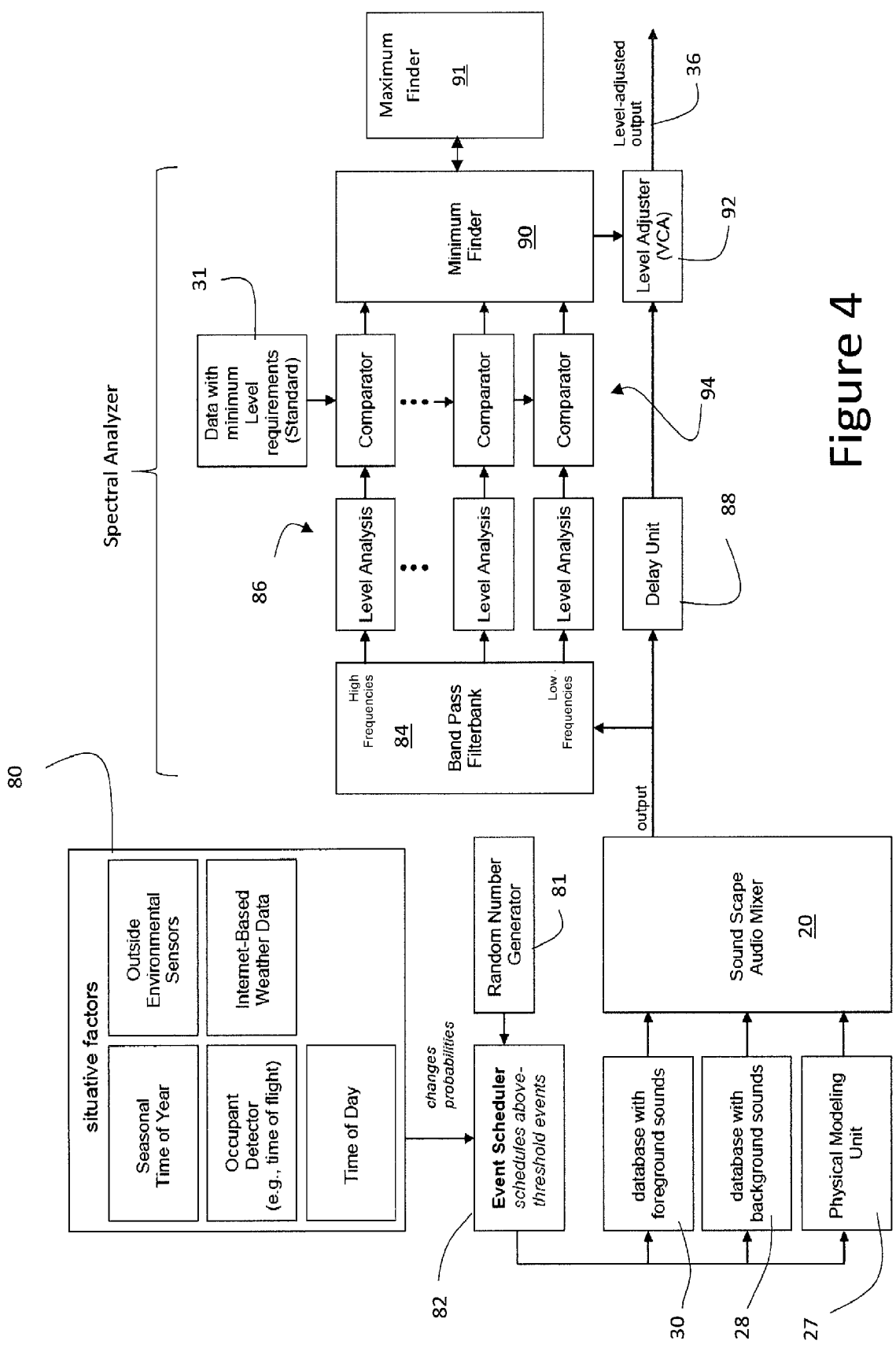
FIG. 4 depicts a flow diagram of a method of implementing a natural soundscape masking system according to embodiments.

FIG. 4 depicts a flow diagram of a process for implementing natural soundscape masking system 18. In this example, a set of situative factors 80 are collected and fed into an event scheduler 82 along with output from a random number generator 81. Illustrative situative factors 80 include seasonal time of year, occupant sensors, time of day, (internal and external) environment sensors and internet based weather data. Based on these inputs, event scheduler 82 selects a sequence of sound samples from a foreground sound database 30 and/or a background sound database 28; or causes sound samples to be created by a sound generator 27 (e.g., a physical modeling unit). The sound samples are processed by sound mixer 20 to create an audio output stream 36. In this embodiment, the audio output stream 36 is fed to a band pass filter bank 84 that outputs a level analysis 86 of a set of frequency bands. The level analysis 86 of each frequency band is fed into a comparator 94 to determine if a minimum level for each band is met, as determined by specified acoustic criterion 31.

A minimum finder 90 feeds the results to an equalizer shown as level adjuster (e.g., voltage control amplified) 92 to boost any of the frequency bands that fall below the minimum threshold. A delay unit 88 is used to delay the audio output stream 36 such that any delay caused by the analysis and level adjustment is offset by the delay unit 88.

In addition to boosting the output of different frequency bands, level adjuster 92 may cause additional sound samples to be overlaid on the audio output stream 36 to ensure minimum levels are being met. Additionally, as noted, criteria 31 may include maximum levels that can be evaluated with comparator 94 to ensure that maximum levels are also met (i.e., not exceeded). In this case, maximum finder 91 may be used to specify which frequency bands need level reduction. Level adjuster 92 may then strip away sounds from one or more frequency bands if the minimum level is exceeded by too big a threshold, to avoid producing a sound field much higher than the minimum required.

Natural soundscape masking system 18 may be implemented in hardware, software or a combination thereof. Hardware may be implemented with special purpose devices to carry out the functions described herein. Software may be implemented as a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 3 depicts an illustrative computing system 10 that may comprise any type of computing device and, and for example includes at least one processor 12, memory 16, an input/output (I/O) 14 (e.g., one or more I/O interfaces and/or devices), and a communications pathway. In general, processor(s) 12 execute program code which is at least partially fixed in memory 16. While executing program code, processor(s) 12 can process data, which can result in reading and/or writing transformed data from/to memory and/or I/O 14 for further processing. The pathway provides a communications link between each of the components in computing system 10. I/O 14 can comprise one or more human I/O devices, which enable a user to interact with computing system 10.

Furthermore, it is understood that the natural soundscape masking system 18 and/or relevant components thereof may also be automatically or semi-automatically deployed into a computer system by sending the components to a central server or a group of central servers. The components are then downloaded into a target computer that will execute the components. The components are then either detached to a directory or loaded into a directory that executes a program that detaches the components into a directory. Another alternative is to send the components directly to a directory on a client computer hard drive. When there are proxy servers, the process will, select the proxy server code, determine on which computers to place the proxy servers' code, transmit the proxy server code, then install the proxy server code on the proxy computer. The components will be transmitted to the proxy server and then it will be stored on the proxy server.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The invention claimed is:

1. A method of generating sound masking in an open-plan space, comprising:
   establishing acoustic criteria for the space that specifies minimum output levels at a set of specified frequencies;
   selecting natural foreground sound samples and natural background sound samples for mixing as an audio output stream for the space based on sensor data from outside the space and based on an internal state of at least one occupant of the space;
   mixing the natural foreground sound samples and natural background sound samples to create a natural audio output stream for use as sound masking when broadcast over at least one speaker using a power amplifier; and
   processing the natural audio output stream, wherein the processing includes:
      analyzing the audio output stream with a spectrum analyzer to determine if the minimum output levels at the set of specified frequencies are met; and
      level adjusting the audio output stream with an equalizer to ensure that minimum output levels at the set of specified frequencies are met;
   wherein the natural foreground sound samples and natural background samples include natural sounds such that the sound masking being broadcast forms a natural soundscape.

2. The method of claim 1, wherein:
   analyzing further includes determining if the audio output stream at each of the set of specified frequencies are below a maximum output level; and
   level adjusting further includes ensuring that the audio output stream at each of the set of specified frequencies are below the maximum output level.

3. The method of claim 1, wherein mixing sound samples includes obtaining a sequence of sound samples from stored files.

4. The method of claim 1, wherein mixing sound samples includes generating a sequence of sound samples using at least one of a physical model and a stochastic process.

5. The method of claim 1, wherein the audio output stream is analyzed prior to being broadcast.

6. The method of claim 1, wherein the audio output stream is analyzed after being obtained from a microphone in the open-plan space.

7. The method of claim 1, wherein each of the sound samples are selected using a random process to provide a non-repetitive mix.

8. The method of claim 7, wherein sound samples are superimposed.

9. The method of claim 1, further comprising applying spatial sound processing to the audio output stream.

10. The method of claim 1, wherein the natural background sounds provide sound masking and the natural foreground sounds include event-driven sounds to provide signature moments.

11. The method of claim 1, wherein the natural background sounds and the natural foreground sounds are determined from sensor data within the open-plan space as well as the sensor data from outside the space.

12. The method of claim 1, wherein selection of the natural background sounds and the natural foreground sounds are determined based on at least one of: time of day, time of year, current weather conditions, and room occupancy.

13. The method of claim 1, wherein the acoustic criteria are periodically adjusted based on at least one of: time, day of the week, room occupancy, and sensor feedback.

14. A system for generating sound masking, comprising:
   a plurality of speakers and a power amplifier;
   a system for establishing acoustic criteria for a space that specifies minimum and maximum output levels at a set of specified frequencies;
   a system for sampling natural foreground sound samples and natural background sound samples from an internal sensor and an external sensor;
   a system for selecting natural foreground sound samples and natural background sound samples for mixing as a natural audio output stream for the space based on sensor data from the external sensor and based on an internal state of at least one occupant of the space;
   a system for mixing the natural foreground sound samples and the natural background sound samples to create a first audio output stream and a second audio output stream for use as sound masking when broadcast over the plurality of speakers using the power amplifier; and a system for processing the first and second audio output streams, wherein the system for processing includes:
- a spectral analyzer that analyzes the first and second audio output streams to determine if the minimum and maximum output levels at the set of specified frequencies are met;
- an equalizer that level adjusts the first and second audio output streams to ensure that the minimum and maximum output levels at the set of specified frequencies are met; and
- a spatial sound processor that decorrelates the first audio output stream with the second audio output stream, wherein the natural foreground sound samples and natural background samples include natural sounds such that the sound masking being broadcast forms a natural soundscape.

15. The system of claim 14, wherein the sound samples are obtained from stored files.

16. The system of claim 14, wherein the sound samples are generated using at least one of a physical model and a stochastic process.

17. The system of claim 14, wherein at least one of the first audio output stream and the second audio output stream is analyzed prior to being broadcast.

18. The system of claim 14, wherein at least one of the first audio output stream and the second audio output stream is analyzed after being obtained from a microphone in the open-plan space.

19. The system of claim 14, wherein each of the sound samples are selected using a random process to provide a non-repetitive mix.

20. The system of claim 19, wherein sound samples are superimposed.

21. The system of claim 14, wherein the natural background sounds provide sound masking and the natural foreground sounds include event-driven sounds to provide signature moments.

22. The system of claim 14, wherein selection of the natural background sound samples and natural foreground sound samples are determined from sensor data within the open-plan space and sensor data from outside the open-plan space.

23. The system of claim 22, wherein selection of the natural background sound samples and natural foreground sound samples are used to simulate at least one of: time of day, time of year, current weather conditions, and room occupancy.

24. The system of claim 14, wherein the acoustic criteria is periodically adjusted based on at least one of: time, day of the week, room occupancy, and sensor feedback.

25. A computer program product stored on a computer readable storage medium, which when executed by a computing system, provides sound masking, comprising:
- program code for establishing acoustic criteria for a space that specifies minimum output levels at a set of specified frequencies;
- program code for selecting natural foreground sound samples and natural background sound samples for mixing as an audio output stream for the space based on sensor data from outside the space and based on an internal state of at least one occupant of the space;
- program code for mixing the natural foreground sound samples and the natural background sound samples to create an audio output stream for use as sound masking when broadcast over at least one speaker using a power amplifier; and
- program code for processing the audio output stream, wherein the processing includes:
  - program code that analyzes the audio output to determine if the minimum output levels at the set of specified frequencies are met; and
  - program code that level adjusts the audio output to ensure that minimum output levels at the set of specified frequencies are met;

wherein the natural foreground sound samples and natural background samples include natural sounds such that the sound masking being broadcast forms a natural soundscape.

26. The computer program product of claim 25, wherein:
- the acoustic criteria further establishes maximum output levels at the set of specified frequencies;
- the program code that analyzes determines if the audio output stream at the set of specified frequencies are below the maximum output levels; and
- the program code that level adjusts ensures that the audio output stream at the set of specified frequencies are below the maximum output levels.

27. The method of claim 1, wherein the audio output stream is level adjusted to comply with an ASTM sound masking standard.

* * * * *